(12) United States Patent
Kwon

(10) Patent No.: US 8,559,260 B2
(45) Date of Patent: Oct. 15, 2013

(54) REGULATOR CIRCUIT AND SEMICONDUCTOR MEMORY DEVICE INCLUDING THE SAME

(75) Inventor: Tae Heui Kwon, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 236 days.

(21) Appl. No.: 12/982,646

(22) Filed: Dec. 30, 2010

(65) Prior Publication Data
US 2011/0158027 A1   Jun. 30, 2011

(30) Foreign Application Priority Data

Dec. 31, 2009  (KR) .................. 10-2009-0135643

(51) Int. Cl.
*G11C 5/14*   (2006.01)
*G05F 1/10*   (2006.01)

(52) U.S. Cl.
USPC ......................................... 365/226; 327/539

(58) Field of Classification Search
None
See application file for complete search history.

(56) References Cited

U.S. PATENT DOCUMENTS 5,822,247 A  *  10/1998  Tassan Caser et al. .. 365/185.18

FOREIGN PATENT DOCUMENTS

KR   1020080038924 A   5/2008

* cited by examiner

*Primary Examiner* — Hoai V Ho
*Assistant Examiner* — James G Norman
(74) *Attorney, Agent, or Firm* — William Park & Associates Patent Ltd.

(57) ABSTRACT

A semiconductor memory device includes a charge pump circuit for generating a pass pump voltage in response to a clock signal and a pump enable signal and a regulator circuit for maintaining the pass pump voltage in the same level as a program pass voltage during a program operation and discharging the program pass voltage during a verification operation so that the program pass voltage has the same level as a verification pass voltage.

16 Claims, 5 Drawing Sheets

US 8,559,260 B2

REGULATOR CIRCUIT AND SEMICONDUCTOR MEMORY DEVICE INCLUDING THE SAME

CROSS-REFERENCE TO RELATED APPLICATION

Priority to Korean patent application number 10-2009-0135643 filed on Dec. 31, 2009, the entire disclosure of which is incorporated by reference herein, is claimed.

BACKGROUND

Exemplary embodiments relate to a regulator circuit and a semiconductor memory device including the same and, more particularly, to a regulator circuit and a semiconductor memory device including the same, which are capable of reducing current consumption by stabilizing a voltage level.

FIG. 1 is a voltage waveform graph showing the waveforms of selected and unselected word lines Sel WL, Unsel WL among the word lines connected to memory cells in a semiconductor memory device when program and verification operations are performed.

Referring to FIG. 1, during a program operation, a program voltage Vpgm and a pass voltage VPASS are supplied to the appropriate ones of the selected and unselected word lines Sel WL, Unsel WL. The program voltage Vpgm is a high voltage (of about 20 V) and higher than the pass voltage. That is, a program voltage Vpgm of about 20 V or higher is supplied to the selected word lines Sel WL connected to memory cells to be programmed, and the pass voltage VPASS of about 9 V is supplied to the unselected word lines Unsel WL connected to the memory cells not to be programmed.

After providing the program voltage to the selected word line SEL WL, a verification operation is performed to detect current flowing through the cell string in order to check whether the memory cells were programmed normally. A verification voltage Vread is provided to the selected word lines Sel WL, and the pass voltage VPASS of about 6.5 V is supplied to the unselected word line Unsel WL.

During a program operation, the pass voltage VPASS of 9V is provided to the unselected word lines Unsel WL as described above, but during the period of a verification operation, the pass voltage VPASS is lowered to 6.5 V. This is for the purpose of preventing a threshold voltage distribution of memory cells, which could rise owing to a read disturbance phenomenon occurring when the pass voltage VPASS of 9 V is supplied during the verification operation as in the program operation, from having a bad influence on the cell characteristic and distribution.

FIG. 2 shows the voltage waveforms of a pass voltage and the signals utilized in a conventional circuit for controlling the voltage level of unselected word lines in a semiconductor memory device.

In a conventional circuit, a charge pump circuit (not shown) is driven to generate a pass pump voltage (not shown), and a regulator (not shown) generates a pass voltage VPASS by using the pass pump voltage. Next, a switch (not shown) receives the pass voltage VPASS and supplies it to the unselected word lines Unsel WL.

When a semiconductor memory device switches from a program operation to a verification operation in a conventional manner, FIG. 2 shows that the unselected word lines Unsel WL are discharged to 0 V due to inactivation of the switch that performs to provide the received pass voltage VPASS to the unselected word lines Unsel WL.

In a conventional circuit, a regulator would generate a constant pass voltage VPASS by down-converting the pass pump voltage by comparing a bandgap voltage and a feedback voltage generated by feeding back the voltage level of an output node.

When the pass voltage VPASS level is normal during the program to verification operation switch, the pass voltage VPASS is discharged for a short time before it is set to a target level. However, when the pass voltage VPASS level is abnormal, the time for discharging the pass voltage VPASS becomes long, and so the switch may be activated during the time for which the pass voltage VPASS is discharged to the target level. Then, the voltage level of the unselected word line Unsel WL becomes higher than the target level, which is unstable, for a lapse of time until the unselected word lines Unsel WL reaches the target level and be stabilized. A path along which the pass voltage VPASS is discharged when a program operation switches to a verification operation includes a path to the resistor of the regulator and a path to a transistor at the output terminal of the regulator. In order to reduce the current flow of the pump pass voltage from the charge pump circuit to the resistor in the regulator, a resistor in the regulator is of a high resistance value. Then, the pass voltage VPASS is discharged through the transistor at the output terminal of the regulator. The amount of discharge current varies according to the temperature characteristic of the transistor. This leads to increased enable period of a word line discharge signal with consideration taken of the change in the amount of discharge current. In this case, the pass voltage VPASS may drop to a level lower than the target level, and restoration of the pass voltage VPASS will require undesirable current consumption and time.

BRIEF SUMMARY

Exemplary embodiments relate to a regulator circuit, which is capable of detecting a pass voltage generated on the basis of a received pass pump voltage and stabilizing the pass voltage for a short or other predetermined time by automatically controlling the period in which the pass voltage is discharged, and a semiconductor memory device including the same.

A semiconductor memory device according to an aspect of the present disclosure comprises a charge pump circuit for generating a pass pump voltage in response to a clock signal and a pump enable signal and a regulator circuit for maintaining the pass pump voltage in the same level as a program pass voltage during a program operation and discharging the program pass voltage during a verification operation so that the program pass voltage has the same level as a verification pass voltage.

A regulator circuit according to an aspect of the present disclosure comprises a regulator for receiving a pass pump voltage and a bandgap voltage and generating a pass voltage, a discharge circuit for discharging the pass voltage to a predetermined voltage level by comparing the bandgap voltage and a feedback voltage obtained by using the pass voltage, and a control circuit for generating a control signal for enabling the discharge circuit in response to a regulator discharge control signal, generated by the discharge circuit, and a regulator discharge signal activated for a predetermined time in a period in which a program operation switches to a verification operation.

DESCRIPTION OF EMBODIMENTS

Hereinafter, some exemplary embodiments of the present disclosure will be described in detail with reference to the accompanying drawings. The figures are provided to allow those having ordinary skill in the art to understand the scope of the embodiments of the disclosure.

Figure 1:
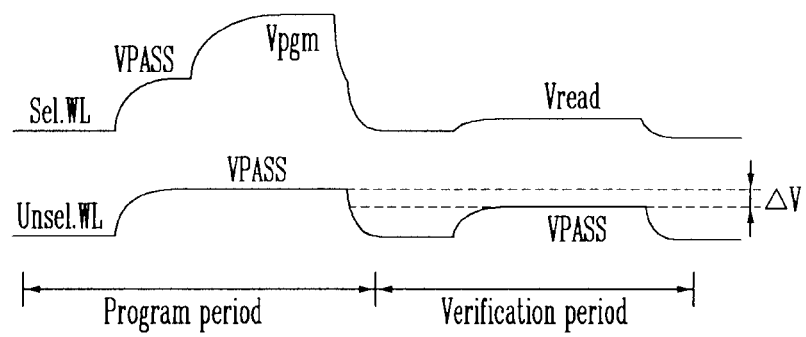
FIG. 1 shows the voltage waveforms of a selected word line Sel WL and an unselected word line Unsel WL when the program operation and the verification operation of a semiconductor memory device are performed.
Figure 2:
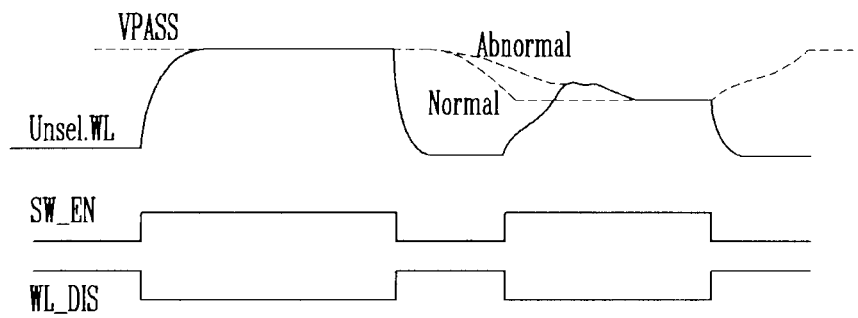
FIG. 2 shows the conventional waveforms of a pass voltage and signals for controlling the voltage level of an unselected word line in a known semiconductor memory device.
Figure 3:
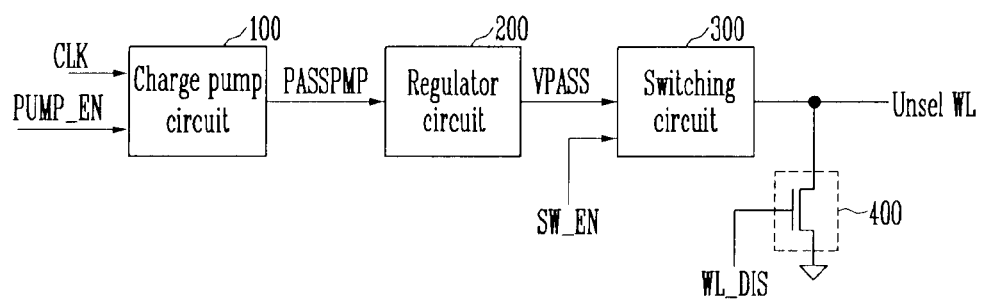
FIG. 3 is a block diagram showing the construction of a semiconductor memory device according to an exemplary embodiment of this disclosure.

FIG. 3 is a block diagram showing the construction of a semiconductor memory device according to an exemplary embodiment of this disclosure.

Referring to FIG. 3, the semiconductor memory device includes a charge pump circuit 100, a regulator circuit 200, a switching circuit 300, and a word line discharge circuit 400.

The charge pump circuit 100 generates a pass pump voltage PASSPMP of about 15 V in response to a clock signal CLK and a pump enable signal PUMP_EN.

The regulator circuit 200 receives the pass pump voltage PASSPMP and generates a pass voltage VPASS by down-converting the pass pump voltage PASSPMP.

The switching circuit 300 supplies the pass voltage VPASS to an unselected word line Unsel WL in response to a switch enable signal SW_EN.

The word line discharge circuit 400 discharges the unselected word line Unsel WL to 0 V in response to a discharge signal WL_DIS.

Figure 4:
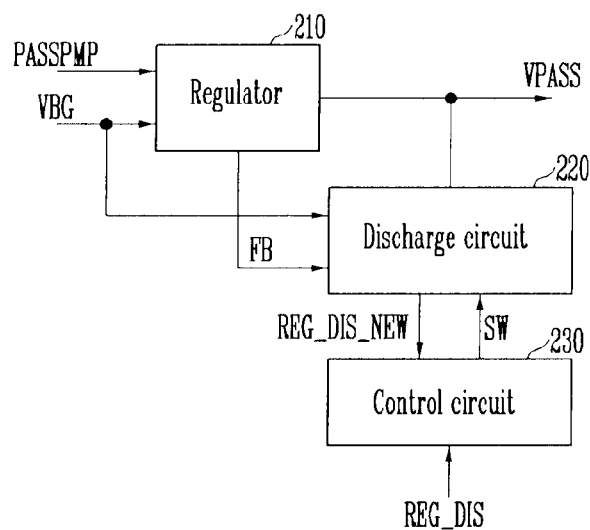
FIG. 4 is a block diagram showing the construction of a regulator circuit 200 shown in FIG. 3 according to an exemplary embodiment of this disclosure.

FIG. 4 is a block diagram showing the regulator circuit 200 according to an exemplary embodiment of this disclosure.

Referring to FIG. 4, the regulator circuit 200 includes a regulator 210, a discharge circuit 220, and a control circuit 230.

The regulator 210 receives the pass pump voltage PASSPMP and a bandgap voltage VBG and generates the pass voltage VPASS.

The discharge circuit 220 compares the bandgap voltage VBG and a feedback voltage FB generated by the regulator 210, and discharges the pass voltage VPASS to a predetermined voltage level.

The control circuit 230 generates a control signal SW for enabling the discharge circuit 220 in response to a regulator discharge signal REG_DIS and a regulator discharge control signal REG_DIS_NEW generated by the discharge circuit 220.

Figure 5:
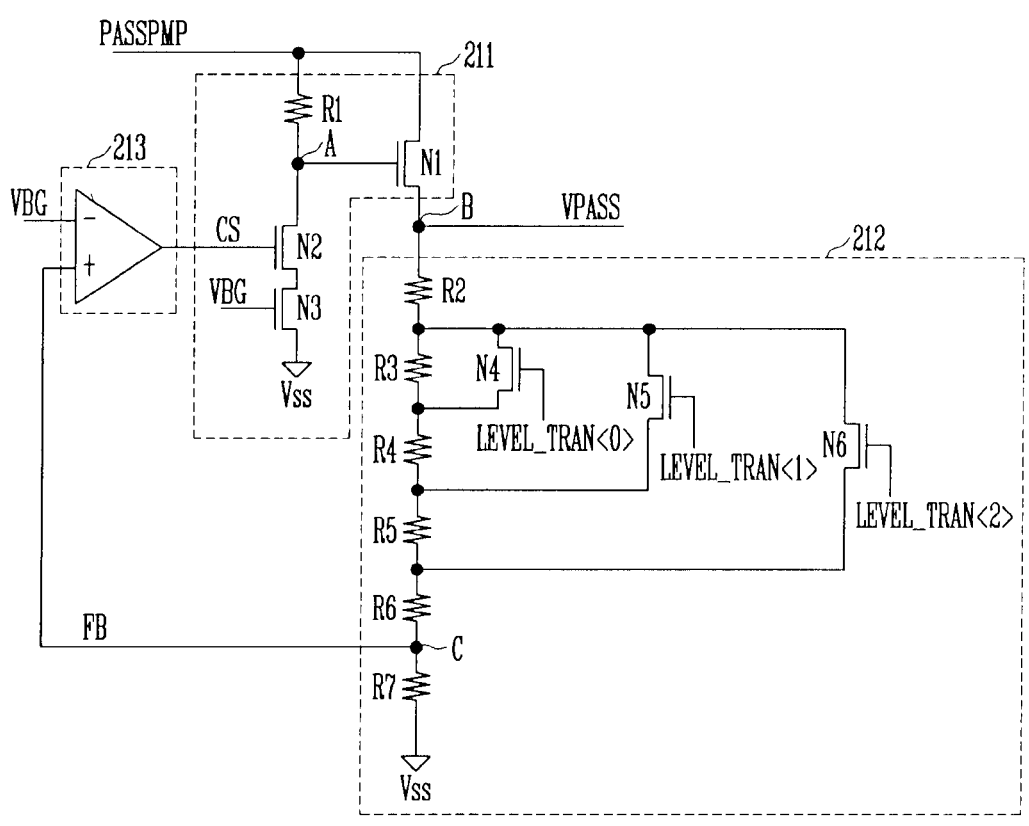
FIG. 5 is a detailed circuit diagram of a regulator 210 shown in FIG. 4.

FIG. 5 is a detailed circuit diagram of the regulator 210 shown in FIG. 4.

Referring to FIG. 5, the regulator 210 includes a pass voltage generator 211, a feedback voltage generator 212, and a comparison signal generator 213.

The pass voltage generator 211 generates the pass voltage VPASS by down-converting the pass pump voltage PASSPMP in response to a comparison signal CS generated by the comparison signal generator 213.

The pass voltage generator 211 includes a resistor R1 and a plurality of NMOS transistors N1 to N3. The resistor R1 and the NMOS transistors N2 and N3 are coupled in series between a ground terminal Vss for ground voltage and the input terminal to which the pass pump voltage PASSPMP is inputted. The NMOS transistor N2 is turned on in response to the comparison signal CS of the comparison signal generator 213, and the NMOS transistor N3 is turned on in response to the bandgap voltage VBG. Accordingly, when the NMOS transistors N2 and N3 are turned on at the same time, voltage distributed from the pass pump voltage PASSPMP is supplied to a node A between the resistor R1 and the NMOS transistor N2 on the basis of a ratio of a resistance value of the resistor R1 and a resistance value of the NMOS transistors N2 and N3. The NMOS transistor N1 is coupled between an output node B and the input terminal to which the pass pump voltage PASSPMP is inputted. The NMOS transistor N1 generates the down-converted pass voltage VPASS by controlling the amount of current of the pass pump voltage PASSPMP provided to the output node B according to the voltage level at the node A.

The feedback voltage generator 212 distributes the pass voltage VPASS in a predetermined distribution ratio and generates the feedback voltage FB.

The feedback voltage generator 212 includes a plurality of resistors R2 to R7 and a plurality of NMOS transistors N4 to N6. The plurality of resistors R2 to R7 is coupled in series between the ground terminal Vss for ground voltage and the output node B of the pass voltage generator 211. The plurality of NMOS transistors N4 to N6 is coupled in parallel to respective nodes between the resistor R2 and other respective resistors. The NMOS transistors N4 to N6 are turned on in response to respective level transfer signals LEVEL_TRAN<2:0>. Accordingly, the total resistance value of the resistors coupled between the output node B and the ground terminal Vss for ground voltage is changed in response to the level transfer signals LEVEL_TRAN<2:0>. The feedback voltage generator 212 controls the voltage level of a node C by controlling the total resistance value of the connected resistors R2 to R6 in response to the plurality of level transfer signals LEVEL_TRAN<2:0> and outputs the feedback voltage FB according to the controlled voltage level of the node C. That is, the feedback voltage FB is generated by distributing the pass voltage VPASS in a predetermined distribution ratio.

The comparison signal generator 213 generates the comparison signal CS by comparing the bandgap voltage VBG and the feedback voltage FB.

The comparison signal generator 213 includes an OP amp. The comparison signal generator 213 compares the bandgap voltage VBG and the feedback voltage FB. When the bandgap voltage VBG is higher than the feedback voltage FB, the comparison signal generator 213 generates the comparison signal CS of a logic low level. When the bandgap voltage VBG is lower than the feedback voltage FB, the comparison signal generator 213 generates the comparison signal CS of a logic high level.

Accordingly, when the bandgap voltage VBG is lower than the feedback voltage FB, the pass voltage generator 211 lowers the voltage level of the pass voltage VPASS by discharging the voltage level of the node A. When the bandgap voltage VBG is higher than the feedback voltage FB, the pass voltage generator 211 raises the voltage level of the pass voltage VPASS by precharging the voltage level of the node A. It should be noted that the choice of high level or low level (also higher or lower) is a matter of circuit design choice, and a circuit of the present invention is not limited just to that particular choice in an exemplary embodiment of the present invention.

Figure 6:
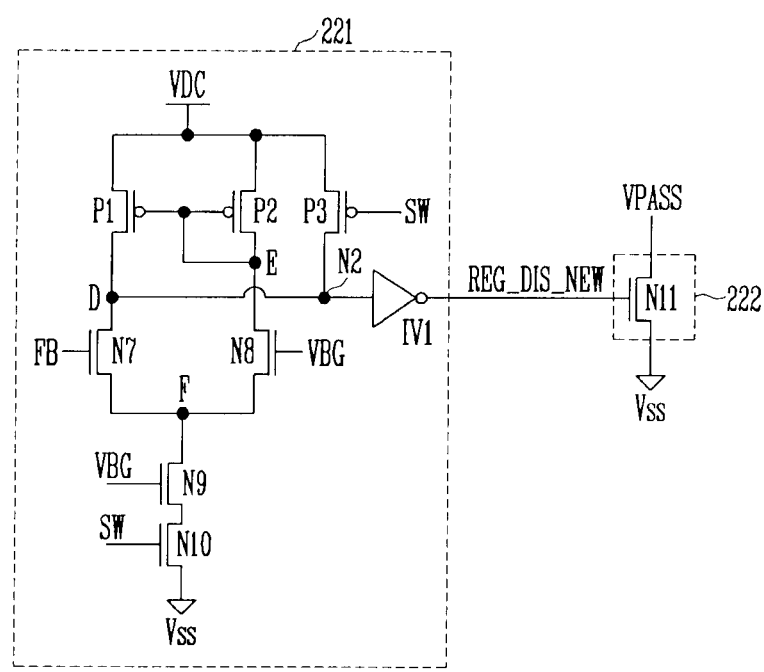
FIG. 6 is a detailed circuit diagram of a discharge circuit 220 shown in FIG. 4.

FIG. 6 is a detailed circuit diagram of the discharge circuit 220 shown in FIG. 4.

Referring to FIG. 6, the discharge circuit 220 includes a differential amplifier unit 221 and a discharge unit 222.

The differential amplifier unit 221 generates the regulator discharge control signal REG_DIS_NEW by comparing the bandgap voltage VBG and the feedback voltage FB.

The differential amplifier unit 221 includes a plurality of PMOS transistors P1 to P3, a plurality of NMOS transistors N7 to N10, and an inverter IV1.

The PMOS transistor P1 is coupled between a terminal VDC for power supply voltage and a node D, and the PMOS transistor P2 is coupled between the terminal VDC and a node E. The PMOS transistors P1 and P2 control the amount of current flowing between the terminal VDC and the node D and the amount of current flowing between the terminal VDC and the node E according to the voltage level of the node E. The NMOS transistor N7 is coupled between the node D and a node F and configured to control the amount of current flowing between the node D and the node F on the basis of the feedback voltage FB. The NMOS transistor N8 is coupled between the node E and the node F and configured to control the amount of current flowing between the node E and the node F on the basis of the bandgap voltage VBG. The NMOS transistors N9 and N10 are coupled in series between the node F and the ground terminal Vss for ground voltage and configured to supply the ground voltage Vss to the node F in response to the bandgap voltage VBG and the control signal SW. The inverter IV1 is coupled to the node D and configured to generate the regulator discharge control signal REG_DIS_NEW by inverting the voltage level of the node D. The PMOS transistor P3 is coupled between the node D and the terminal VDC for power supply voltage and configured to supply the power supply voltage VDC to the node D in response to the control signal SW.

When the control signal SW of a high level and the feedback voltage FB higher than the bandgap voltage VBG are received, the amount of current flowing between the node D and the node F becomes greater than the amount of current flowing between the node E and the node F. Accordingly, the voltage level of the node D becomes lower than that of the node E, and so the regulator discharge control signal REG_DIS_NEW of a high level is outputted. On the other hand, when the feedback voltage FB lower than the bandgap voltage VBG is received, the amount of current flowing between the node D and the node F becomes smaller than the amount of current flowing between the node E and the node F. Accordingly, the voltage level of the node D becomes higher than that of the node E, and so the regulator discharge control signal REG_DIS_NEW of a low level is outputted.

The discharge unit 222 discharges the pass voltage VPASS in response to the regulator discharge control signal REG_DIS_NEW. The discharge unit 222 may include an NMOS transistor N11.

Accordingly, when the feedback voltage FB higher than the bandgap voltage VBG is received, the discharge circuit 220 discharges the pass voltage VPASS.

Figure 7:
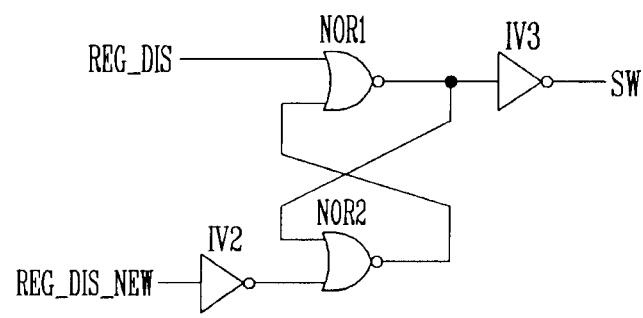
FIG. 7 is a detailed circuit diagram of a control circuit 230 shown in FIG. 4.

FIG. 7 is a detailed circuit diagram of the control circuit 230 shown in FIG. 4.

The control circuit 230 generates the control signal SW in response to the regulator discharge signal REG_DIS and the regulator discharge control signal REG_DIS_NEW generated by the discharge circuit 220.

The control circuit 230 includes inverters IV2 and IV3 and NOR gates NOR1 and NOR2. The NOR gate NOR1 outputs a logic signal in response to the regulator discharge signal REG_DIS and the output signal of the NOR gate NOR2. The inverter IV3 inverts the output signal of the NOR gate NOR1 and outputs the control signal SW. The inverter IV2 inverts the regulator discharge control signal REG_DIS_NEW and outputs an inverted signal. The NOR gate NOR2 outputs a logic signal in response to the output signal of the inverter IV2 and the output signal of the NOR gate NOR1.

During the period in which a program operation switches to a verification operation, the NOR gate NOR1 generates the output signal of a low level in response to the regulator discharge signal REG_DIS enabled in a high level. The inverter IV3 outputs the control signal SW of a high level by inverting the output signal of a low level outputted from the NOR gate NOR1. In response thereto, the discharge circuit 220 is activated. The regulator discharge signal REG_DIS shifts to a low level after a lapse of a predetermined time, but if the pass voltage VPASS has to be further discharged on the basis of a comparison result of the discharge circuit 220 between the feedback voltage FB and the bandgap voltage VBG, the regulator discharge control signal REG_DIS_NEW of a high level is supplied. In response to the discharge control signal REG_DIS_NEW of a high level, the inverter IV2 generates the output signal of a low level and the NOR gate NOR2 generates the output signal of a high level. Although regulator discharge signal REG_DIS shifts to a low level, the NOR gate NOR1 outputs a low level signal in response to a high level output signal from the NOR gate NOR2. In response to the output signal of a low level, the control signal SW of a high level is generated.

Therefore, even though the regulator discharge signal REG_DIS is activated only for a short time during the period in which a program operation switches to a verification operation, the control circuit 230 outputs the activated control signal SW so that the discharge circuit 220 can continuously perform the discharge operation.

Figure 8:
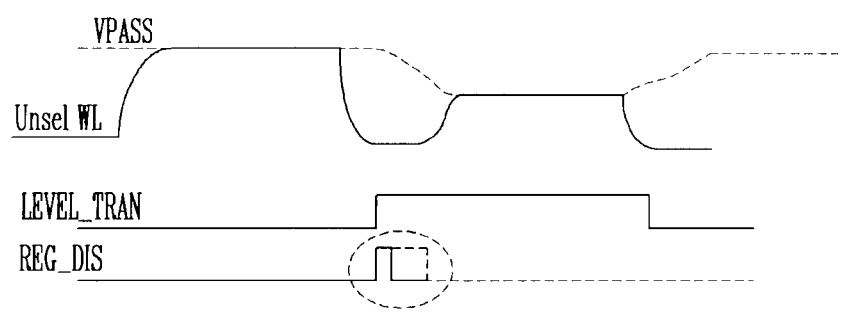
FIG. 8 is a graph showing the voltage level of an unselected word line and a pass voltage, for illustrating the operation of the semiconductor memory device according to an exemplary embodiment of this disclosure.

FIG. 8 is a graph showing the voltage level waveforms of an unselected word line UnselWL and a pass voltage VPASS for illustration of an operation according to an exemplary embodiment of this disclosure.

A period during which the operation of a semiconductor device switches from a program operation to a verification operation is described below with reference to FIGS. 3 to 8.

Although the regulator discharge signal REG_DIS is activated only for a short time during the period in which a program operation switches to a verification operation, the control circuit 230 outputs the activated control signal SW so that the discharge circuit 220 can continuously perform a discharge operation.

When the control signal SW of a high level is received from the control circuit 230 and the feedback voltage FB higher than the bandgap voltage VBG is received, the amount of current flowing between the node D and the node F of the discharge circuit 220 becomes greater than the amount of current flowing between the node E and the node F. Accordingly, the voltage level of the node D becomes lower than that of the node E, and the regulator discharge control signal REG_DIS_NEW of a high level is outputted. However, when the feedback voltage FB lower than the bandgap voltage VBG is received, the amount of current flowing between the node D and the node F would become less than the amount of current flowing between the node E and the node F. Accordingly, the voltage level of the node D becomes higher than that of the node E, and so the regulator discharge control signal REG_DIS_NEW of a low level is outputted.

In response to the regulator discharge control signal REG_DIS_NEW, the discharge unit 222 of the discharge circuit 220 discharges the pass voltage VPASS used in the program operation up to the voltage level of the pass voltage VPASS used in the verification operation.

As described above, even though the regulator discharge signal is activated for a short time during the period in which a program operation switches to a verification operation, if a generated pass voltage is higher than a target voltage, the period in which the pass voltage is discharged is automatically increased in the regulator circuit according to an exemplary embodiment of this disclosure so that the pass voltage is outputted as a target voltage level. Accordingly, the pass voltage can be quickly stabilized.

In accordance with an exemplary embodiments of this disclosure, the regulator circuit can detect a pass voltage generated on the basis of a received pass pump voltage and stabilize the pass voltage for a short time by automatically controlling the period in which the pass voltage is discharged.

What is claimed is:

1. A semiconductor memory device, comprising:
   a charge pump circuit configured to generate a pass pump voltage in response to a clock signal and a pump enable signal; and
   a regulator circuit configured to regulate the pass pump voltage to output a program pass voltage during a program operation and discharge the program pass voltage to output a verification pass voltage during a verification operation;
   wherein the regulator circuit detects the program pass voltage in a period during which the program operation switches to the verification operation and controls a period in which the program pass voltage is discharged, and
   wherein the regulator circuit comprises:
   a regulator configured to receive the pass pump voltage and a bandgap voltage and generate the program pass voltage;
   a discharge circuit configured to discharge the program pass voltage to a predetermined voltage level by comparing the bandgap voltage and a feedback voltage, generated by the regulator; and
   a control circuit configured to generate a control signal for enabling the discharge circuit in response to a regulator discharge control signal, generated by the discharge circuit and a regulator discharge signal activated for a predetermined time during the period in which the program operation switches to the verification operation.

2. The semiconductor memory device of claim 1, further comprising a switching circuit configured to supply the program pass voltage or the verification pass voltage to a word line.

3. The semiconductor memory device of claim 2, further comprising a word line discharge circuit configured to discharge the word line in response to a discharge signal.

4. The semiconductor memory device of claim 1, wherein the regulator comprises:
   a pass voltage generator configured to generate the program pass voltage by down-converting the pass pump voltage in response to a comparison signal;
   a feedback voltage generator configured to generate the feedback voltage by distributing the program pass voltage in a predetermined distribution ratio; and
   a comparison signal generator configured to generate the comparison signal by comparing the feedback voltage and the bandgap voltage.

5. The semiconductor memory device of claim 1, wherein the discharge circuit comprises:
   a differential amplifier unit configured to generate the regulator discharge control signal by comparing the bandgap voltage and the feedback voltage; and
   a discharge unit configured to discharge the program pass voltage in response to the regulator discharge control signal.

6. The semiconductor memory device of claim 1, wherein, even when the regulator discharge signal becomes inactivated after being activated for the predetermined time during a period in which the program operation switches to the verification operation, the control circuit activates and outputs the control signal if the program pass voltage is higher than the verification pass voltage.

7. A regulator circuit, comprising:
   a regulator configured to receive a pass pump voltage and a bandgap voltage and generating a pass voltage;
   a discharge circuit configured to discharge the pass voltage to a predetermined voltage level by comparing the bandgap voltage and a feedback voltage obtained by using the pass voltage; and
   a control circuit configured to generate a control signal for enabling the discharge circuit in response to a regulator discharge control signal generated by the discharge circuit and a regulator discharge signal activated for a predetermined time during a period in which a program operation switches to a verification operation.

8. The regulator circuit of claim 7, wherein the regulator comprises:
   a pass voltage generator configured to generate the pass voltage by down-converting the pass pump voltage in response to a comparison signal;
   a feedback voltage generator configured to generate the feedback voltage by distributing the pass voltage in a predetermined distribution ratio; and
   a comparison signal generator configured to generate the comparison signal by comparing the feedback voltage and the bandgap voltage.

9. The regulator circuit of claim 7, wherein the discharge circuit comprises:
   a differential amplifier unit configured to generate the regulator discharge control signal by comparing the bandgap voltage and the feedback voltage; and
   a discharge unit configured to discharge the pass voltage in response to the regulator discharge control signal.

10. The regulator circuit of claim 7, wherein, even when the regulator discharge signal becomes inactivated after being activated for the predetermined time during the period in which the program operation switches to the verification operation, the control circuit activates and outputs the control signal if the pass voltage is higher than a target voltage.

11. The regulator circuit of claim 7, wherein the discharge circuit compares the feedback voltage and the bandgap voltage and discharges the pass voltage when the feedback voltage is higher than the bandgap voltage.

12. A semiconductor memory device, comprising:
   a charge pump circuit configured to generate a pass pump voltage in response to a clock signal and a pump enable signal;
   a regulator circuit configured to receive the pass pump voltage and generating a program pass voltage; and
   a switching circuit configured to supply the program pass voltage to a word line, wherein the regulator circuit detects the program pass voltage in a period during which a program operation switches to a verification operation and controls a period in which the program pass voltage is discharged to provide a verification pass voltage used in the verification operation, and wherein the regulator circuit comprises:
a regulator configured to receive the pass pump voltage and a bandgap voltage and generate the program pass voltage;
a discharge circuit configured to discharge the program pass voltage to a predetermined voltage level by comparing the bandgap voltage and a feedback voltage, generated by the regulator; and
a control circuit configured to generate a control signal for enabling the discharge circuit in response to a regulator discharge control signal, generated by the discharge circuit and a regulator discharge signal activated for a predetermined time during the period in which the program operation switches to the verification operation.

13. The semiconductor memory device of claim 12, wherein the regulator comprises:
a pass voltage generator configured to generate the program pass voltage by down-converting the pass pump voltage in response to a comparison signal;
a feedback voltage generator configured to generate the feedback voltage by distributing the program pass voltage in a predetermined distribution ratio; and
a comparison signal generator configured to generate the comparison signal by comparing the feedback voltage and the bandgap voltage.

14. The semiconductor memory device of claim 12, wherein the discharge circuit comprises:
a differential amplifier unit configured to generate the regulator discharge control signal by comparing the bandgap voltage and the feedback voltage; and
a discharge unit configured to discharge the program pass voltage in response to the regulator discharge control signal.

15. The semiconductor memory device of claim 12, wherein, even when the regulator discharge signal becomes inactivated after being activated for the predetermined time during a period in which the program operation switches to the verification operation, the control circuit activates and outputs the control signal if the program pass voltage is higher than the verification pass voltage.

16. The semiconductor memory device of claim 12, wherein the discharge circuit compares the feedback voltage and the bandgap voltage and discharges the pass voltage when the feedback voltage is higher than the bandgap voltage.

* * * * *